United States Patent
Chilton et al.

(10) Patent No.: US 9,652,352 B1
(45) Date of Patent: May 16, 2017

(54) TECHNIQUES FOR STORAGE CAPACITY CONFIGURATION

(75) Inventors: Kendell Chilton, Southborough, MA (US); Sachin More, Northborough, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 1156 days.

(21) Appl. No.: 12/932,827

(22) Filed: Mar. 8, 2011

(51) Int. Cl.
*G06F 12/06* (2006.01)
*G06F 11/34* (2006.01)

(52) U.S. Cl.
CPC .................... *G06F 11/34* (2013.01)

(58) Field of Classification Search
USPC ................ 711/103, 170, E12.078
See application file for complete search history.

(56) References Cited

U.S. PATENT DOCUMENTS

| | | | |
|---|---|---|---|
| 7,865,761 B1 | 1/2011 | Chilton et al. | |
| 8,010,738 B1 | 8/2011 | Chilton et al. | |
| 8,112,596 B2* | 2/2012 | Taguchi et al. | 711/156 |
| 8,151,047 B2* | 4/2012 | Nakagawa et al. | 711/114 |
| 8,239,617 B1* | 8/2012 | Linnell | G06F 12/0246 711/103 |
| 2008/0082726 A1* | 4/2008 | Elhamias | 711/103 |
| 2009/0046512 A1* | 2/2009 | Halloush et al. | 365/185.09 |
| 2010/0220510 A1* | 9/2010 | Shalvi | 365/63 |
| 2011/0099320 A1* | 4/2011 | Lucas et al. | 711/103 |
| 2012/0011340 A1* | 1/2012 | Flynn et al. | 711/171 |
| 2012/0102259 A1* | 4/2012 | Goss et al. | 711/103 |

OTHER PUBLICATIONS

Wear leveling from Wikipedia, http://en.wikipedia.org/w/index.php?title=Wear_leveling&printable=yes, Nov. 10, 2011.
"STEC Small Cards Wear Leveling and Lifetime Calculator", http://www.stec-inc.com/downloads/AN-0702_STEC_SMALL_CARDS_WEAR_LEVELING_LIFETIME_CALCULATOR.pdf, AN-0702, Jan. 5, 2008.
Micron, Technical Note, "Wear-Leveling Techniques in NAND Flash Devices", TN-29-42: Introduction, http://download.micron.com/pdf/technotes/nand/tn2942_nand_wear_leveling.pdf, 2008.
Write amplification from Wikipedia, http://en.wikipedia.org/wiki/Write_amplification, Feb. 12, 2011.

* cited by examiner

*Primary Examiner* — Charles Rones
*Assistant Examiner* — Ryan Dare

(57) ABSTRACT

Described are techniques for reconfiguring a storage device. A first plurality of parameters characterizing the storage device at a first point in time are received. The first plurality of parameters includes a first raw capacity and a first published capacity. The first raw capacity represents a physical storage capacity of the storage device. The first published capacity represents a logical storage capacity of the storage device. A second plurality of parameters is determined characterizing the storage device at a subsequent second point in time. The second plurality of parameters includes a second raw capacity and a second published capacity, The storage device is used at the first point in time as a device having the first plurality of parameters and at the second point in time as a device having the second plurality of parameters.

22 Claims, 4 Drawing Sheets

TECHNIQUES FOR STORAGE CAPACITY CONFIGURATION

BACKGROUND

Technical Field

This application generally relates to data storage, and more particularly to techniques used in connection with storage capacity configuration of a data storage device.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host processor may perform a variety of data processing tasks and operations using the data storage system. For example, a host processor may perform basic system I/O operations in connection with data requests, such as data read and write operations.

Host processor systems may store and retrieve data using a storage device containing a plurality of host interface units, disk drives, and disk interface units. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical disk units, logical devices, or logical volumes (LVs). The logical disk units may or may not correspond to the actual disk drives. Allowing multiple host systems to access the single storage device unit allows the host systems to share data stored therein.

In connection with data storage, a variety of different technologies may be used. Data may be stored on disk devices (as described above), tape devices and flash memory devices, such as USB devices. Different storage technologies, such as a flash memory device, may fail primarily due to wear out or usage, such as after performing a certain number of write cycles to store data on the flash memory device. For example, a flash memory device that uses NAND flash memory and is an SLC (single level cell) device is expected to perform a specified number of writes to a cell. After performing the specified number of writes to the cell, that cell is expected to fail when attempting to subsequently write data thereto. As such, different techniques may be used when writing to the flash memory device. One technique is to use an error correction code (ECC) to allow recovery of data upon the occurrence of a write failure. Another technique is wear leveling which attempts to balance or evenly distribute writes across the physical device locations. Thus, when performing a write operation to a flash memory device, the write operation may be performed to a logical location on the device which is then mapped to a physical location on the device. With wear leveling and flash memory devices, the particular physical location for the same logical location may change in accordance with a mapping of virtual to physical locations in order to achieve the desired equal distribution of writes across physical locations of the device. The foregoing is one example of a data storage technology and cause of wear out where the device may be expected to fail after a specified amount of usage.

In existing systems, a storage device, such as a flash memory device, experiences wear out to a point that a number of cells in the device fail and the device is no longer capable of storing an amount of data based on its configured storage capacity. At this point, the device is considered to have reached the end of its useful life and may be discarded and replaced with another storage device.

SUMMARY OF THE INVENTION

In accordance with one aspect of the invention is a method of reconfiguring a storage device. A first plurality of parameters characterizing the storage device at a first point in time is received. The first plurality of parameters includes a first raw capacity and a first published capacity. The first raw capacity represents a physical storage capacity of the storage device at the first point in time and the first published capacity represents a logical storage capacity of an amount of user-consumable storage of the storage device at the first point in time. A second plurality of parameters is determined characterizing the storage device at a second point in time subsequent to the first point in time. The second plurality of parameters includes a second raw capacity and a second published capacity. The second raw capacity represents a physical storage capacity of the storage device at the second point in time and the second published capacity represents a logical capacity of an amount of user-consumable storage of the storage device at said second point in time. The second raw capacity represents a portion of the storage device capable of storing data at the second point in time. The storage device is used at the first point in time as a device having the first plurality of parameters and the storage device is used at the second point in time as a device having the second plurality of parameters. The storage device may be a solid state storage device. The storage device may be expected to perform a number of operations prior to failure and physical media portions of said storage device at which data is stored may experience failure primarily due to performing said operations so that a remaining expected lifetime of said storage device is determined at any point in time based on a cumulative amount of said operations performed with respect to said storage device up to said any point in time. The operations may be any of a write operation, an erasure operation to erase data currently stored in a portion of said storage device and a program operation to store new data to a portion of said storage device. The first raw capacity may vary in accordance with said first published capacity, X representing an average number of erase operations remaining per unit of storage of said storage device prior to failure, T representing an expected lifetime of the storage device, and W representing a rate at which a number of write operations are performed per unit of time per unit of storage with respect to the storage device. Determining the second plurality of parameters may include determining X' representing a revised average number of erase operations remaining per unit of storage of said storage device at said second point in time prior to failure; and determining a first intermediate published capacity in accordance with X', said first raw capacity, W and T. The method may also include determining a first portion of the storage device incapable of storing data at the second point in time; determining, in accordance with the first portion and the first raw capacity, said second raw capacity that represents a portion of the storage device capable of storing data at said second point in time; determining a second intermediate published capacity in accordance with an overprovisioning factor and said second raw capacity; and determining whether said second intermediate published capacity is less than said first intermediate published capacity. If the second intermediate published capacity is less than the first intermediate published capacity, the method may also include determining the second published capacity using the second intermediate published capacity. The method may also include determining whether the second intermediate published capacity is one of a plurality of predetermined drive capacities; if it is determined that the second intermediate published capacity is one of the predetermined drive capacities, using said second intermediate published capacity as the second published capacity; and if it is determined that the second intermediate published capacity is not one of the predetermined drive capacities, performing first processing including: determining a first of the predetermined drive capacities which is closest to said second intermediate published capacity and is not greater than said second intermediate published capacity; and using said first predetermined drive capacity as said second published capacity. If the second intermediate published capacity is not less than the first intermediate published capacity, the method may further comprise determining said second published capacity using said first intermediate published capacity. The method may also include determining whether the first intermediate published capacity is one of a plurality of predetermined drive capacities; if it is determined that the first intermediate published capacity is one of the predetermined drive capacities, using said first intermediate published capacity as the second published capacity; and if it is determined that the first intermediate published capacity is not one of the predetermined drive capacities, performing first processing including: determining a first of the predetermined drive capacities which is closest to said first intermediate published capacity and is not greater than said first intermediate published capacity; and using said first predetermined drive capacity as said second published capacity. The storage device may be used as a spare device at said second point in time. The storage device may be a flash memory device. The first published capacity and the second published capacity may each be determined in accordance with a same over-provisioning factor.

In accordance with another aspect of the invention is a computer readable medium comprising code stored thereon for reconfiguring a storage device, the computer readable medium comprising code stored thereon for: receiving a first plurality of parameters characterizing said storage device at a first point in time, said first plurality of parameters including a first raw capacity, and a first published capacity, wherein said first raw capacity represents a physical storage capacity of the storage device at the first point in time and said first published capacity represents a logical storage capacity of an amount of user-consumable storage of said storage device at said first point in time; and determining a second plurality of parameters characterizing said storage device at a second point in time subsequent to said first point in time, said second plurality of parameters including a second raw capacity and a second published capacity, wherein said second raw capacity represents a physical storage capacity of the storage device at the second point in time and said second published capacity represents a logical capacity of an amount of user-consumable storage of the storage device at said second point in time, wherein said second raw capacity represents a portion of the storage device capable of storing data at said second point in time, and wherein said storage device is used at said first point in time as a device having said first plurality of parameters and wherein said storage device is used at said second point in time as a device having said second plurality of parameters. The storage device may be a solid state device. The storage device may be expected to perform a number of operations prior to failure and wherein physical media portions of said storage device at which data is stored may experience failure primarily due to performing said operations so that a remaining expected lifetime of said storage device may be determined at any point in time based on a cumulative amount of said operations performed with respect to said storage device up to said any point in time. The operations may be any of a write operation, an erasure operation to erase data currently stored in a portion of said storage device and a program operation to store new data to a portion of said storage device. The first raw capacity may vary in accordance with said first published capacity, X representing an average number of erase operations remaining per unit of storage of said storage device prior to failure, T representing an expected lifetime of the storage device, and W representing a rate at which a number of write operations are performed per unit of time per unit of storage with respect to the storage device. The storage device may be used as a spare device at the second point in time.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
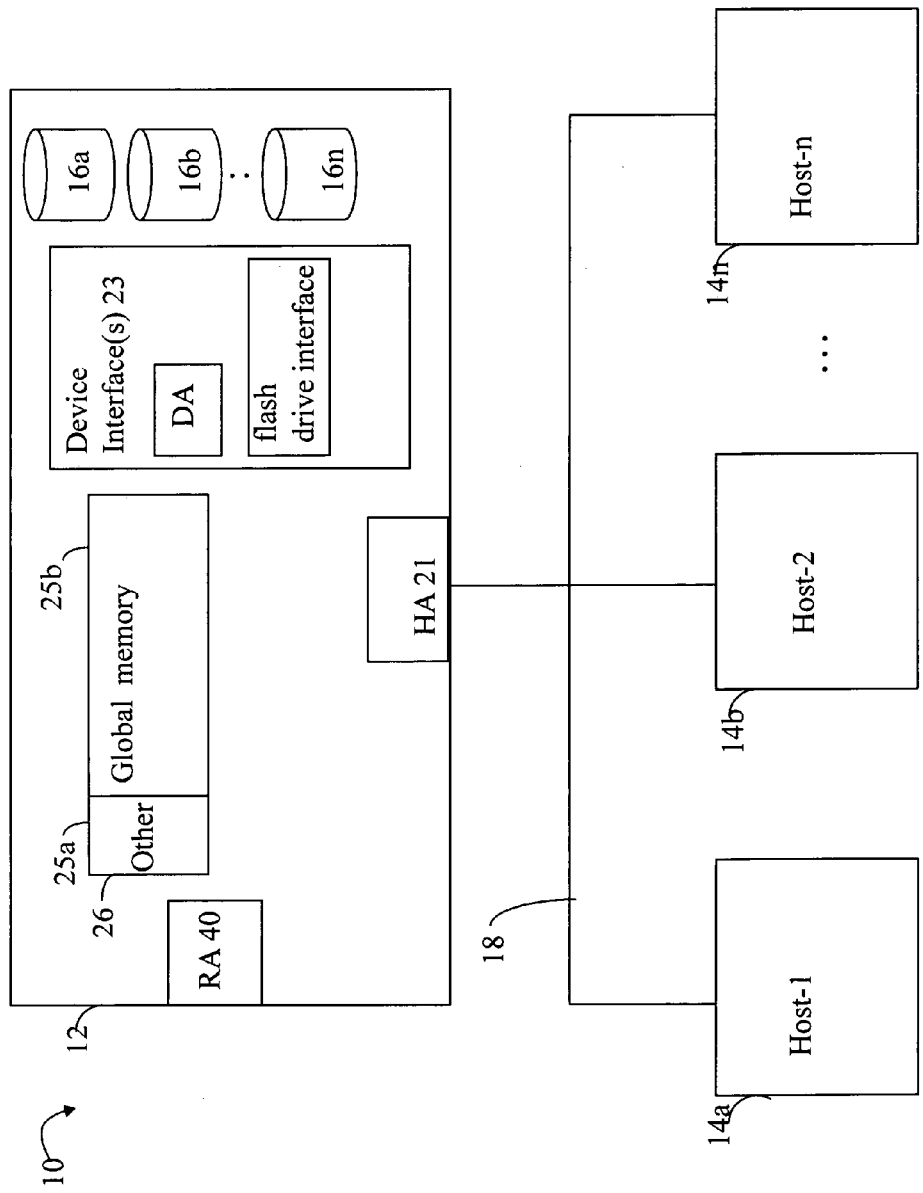
FIG. 1 is an example of an embodiment of a computer system that may utilize the techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as SCSI, Fibre Channel, iSCSI, and the like. Some or all of the connections by which the hosts and data storage system may be connected to the communication medium may pass through other communication devices, such as a Connectrix or other switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN (storage array network), in an embodiment using the techniques herein. It should also be noted that an embodiment may include data storage arrays or other components from one or more vendors. In subsequent examples illustrated the techniques herein, reference may be made to a single data storage array by a vendor, such as by EMC Corporation of Hopkinton, Mass. However, as will be appreciated by those skilled in the art, the techniques herein are applicable for use with other data storage arrays by other vendors and with other components than as described herein for purposes of example.

The data storage system 12 may be a data storage array including a plurality of data storage devices 16a-16n. The data storage devices 16a-16n may include one or more types of data storage devices such as, for example, one or more disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash drives or flash memory-based SSDs are one type of SSD that contains no moving parts. As described in more detail in following paragraphs, the techniques herein may be used in an embodiment in which one or more of the devices 16a-16n are flash drives.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash drive, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices or logical volumes (LVs). The LVs may or may not correspond to the actual physical devices or drives 16a-16n. For example, one or more LVs may reside on a single physical drive or multiple drives. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LV(s) residing thereon. A flash drive interface may be another type of device interface used in connection with facilitating data transfers to/from the associated flash drives and LV(s) residing thereon. It should be noted that an embodiment may use a same device interface for one or more different types of devices than as described herein.

The device interface, such as a DA, performs I/O operations on a drive 16a-16n. In the following description, data residing on an LV may be accessed by the device interface following a data request in connection with I/O operations that other directors originate. Data may be accessed by LV in which a single device interface manages data requests in connection with the different one or more LVs that may reside on a drive 16a-16n. For example, a device interface may be a DA that accomplishes the foregoing by creating job records for the different LVs associated with a particular device. These different job records may be associated with the different LVs in a data structure stored and managed by each device interface.

Figure 2:
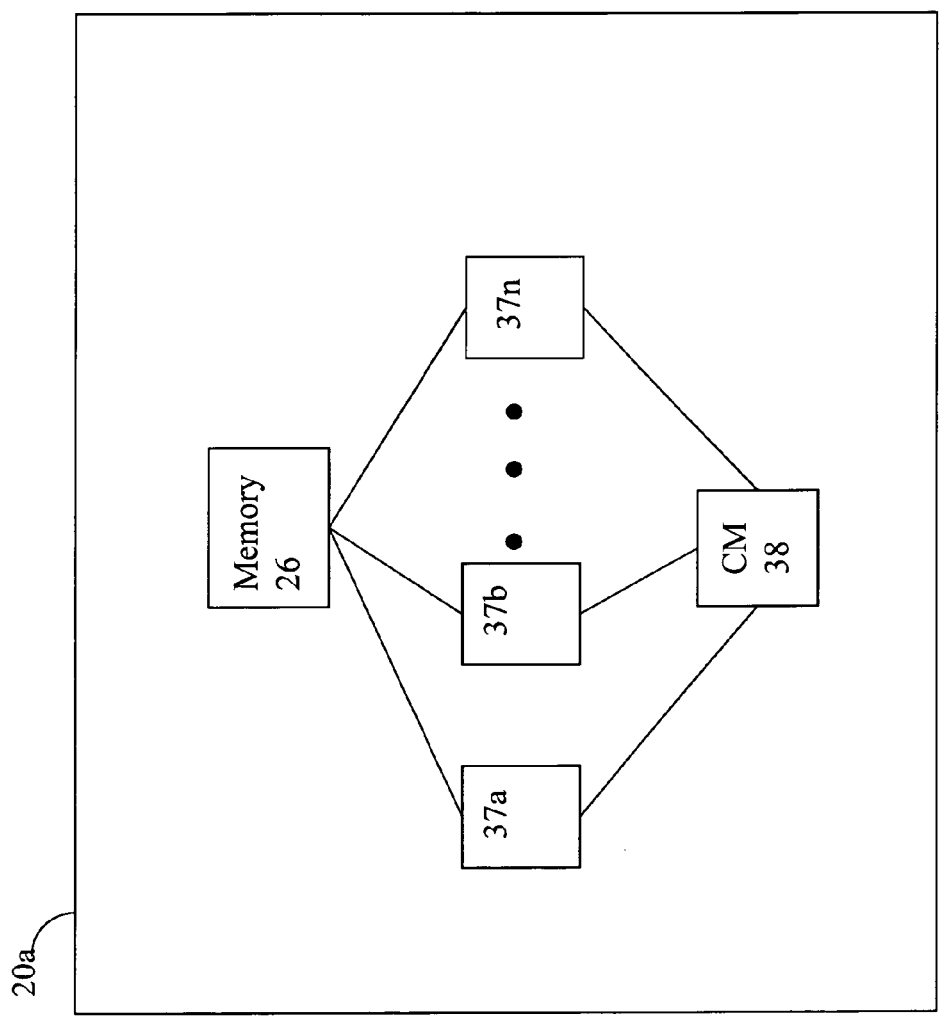
FIG. 2 is a representation of the logical internal communications between the directors and memory included in one embodiment of data storage system of FIG. 1.

Referring to FIG. 2, shown is a representation of the logical internal communications between the directors and memory included in a data storage system. Included in FIG. 2B is a plurality of directors 37a-37n coupled to the memory 26. Each of the directors 37a-37n represents one of the HA's, RA's, or device interfaces that may be included in a data storage system. In an embodiment disclosed herein, there may be up to sixteen directors coupled to the memory 26. Other embodiments may allow a maximum number of directors other than sixteen as just described and the maximum number may vary with embodiment.

The representation of FIG. 2 also includes an optional communication module (CM) 38 that provides an alternative communication path between the directors 37a-37n. Each of the directors 37a-37n may be coupled to the CM 38 so that any one of the directors 37a-37n may send a message and/or data to any other one of the directors 37a-37n without needing to go through the memory 26. The CM 38 may be implemented using conventional MUX/router technology where a sending one of the directors 37a-37n provides an appropriate address to cause a message and/or data to be received by an intended receiving one of the directors 37a-37n. In addition, a sending one of the directors 37a-37n may be able to broadcast a message to all of the other directors 37a-37n at the same time.

With reference back to FIG. 1, components of the data storage system may communicate using GM 25b. For example, in connection with returning data to a host from one of the devices as part of a read operation, the data may be copied from the device by the appropriate device interface, such as a DA servicing the device. The device interface may copy the data read into a cache slot included in GM which is, in turn, communicated to the appropriate HA in communication with the host.

As described above, the data storage system 12 may be a data storage array including a plurality of data storage devices 16a-16n in which one or more of the devices 16a-16n are flash drives. In one embodiment, the data storage system 12 may be a Symmetrix® DMX™ data storage array by EMC Corporation of Hopkinton, Mass. In the foregoing data storage array, the data storage devices 16a-16n may include a combination of disk drives and flash drives in which the flash drives may appear as standard Fibre Channel drives to the various software tools used in connection with the data storage array. The flash drives may be optimized for write longevity using a variety of different techniques known in the art. Additionally, a data storage array may utilize some techniques in connection with flash drives, other SSDs, and also disks. For example, bad blocks, or other portions of a drive may be mapped out so that once discovered, they are not subsequently used for storing data. The flash drives may be constructed using nonvolatile semiconductor NAND flash memory. The flash drive may be an SLC (single level cell) device.

It should be noted that the techniques herein may be used in connection with flash drives comprising what may be characterized as enterprise-grade or enterprise-class flash drives with an expected lifetime (e.g., as measured in an amount of actual elapsed time such as a number of years, months, and/or days) based on a number of guaranteed write cycles and a rate or frequency at which the writes are performed. Thus, a flash drive may be expected to have a usage measured in calendar or wall clock elapsed time based on the amount of time it takes to perform the number of guaranteed write cycles. The techniques herein may also be used with other flash drives, more generally referred to as non-enterprise class flash drives, which, when performing writes at a same rate as for enterprise class drives, may have a lower expected lifetime based on a lower number of guaranteed write cycles.

The techniques herein may be generally used in connection with any type of flash drive for example, a flash drive which is a NAND gate flash device, NOR gate flash device, flash device that uses SLC or MLC (multi-level cell) technology, and the like, as known in the art. As known in the art, MLC, in contrast to SLC, stores more than 1 bit per cell.

More generally, the techniques herein may be used with any type of storage device (e.g., flash-based, other type of SSD, or otherwise) if the lifetime can be determined as a function of a number of write operations (e.g., if the lifetime is based upon, or primarily dependent upon, a number of write cycles to the device). Similarly, the techniques herein may be used to with devices having wear out primarily dependent upon other types of operations besides write operations that may affect the excepted lifetime of a device prior to failure. The techniques herein may be used with generally any type of device where the device has wear out or fails primarily due to a specified level of usage having been performed.

In following paragraphs, reference may be made to examples in which the techniques herein are applied to a flash drive. However, as noted above and will also be appreciated by those skilled in the art, the techniques herein have much broader applicability for use with different types of devices having the same or different primary causes of wear out leading to device failure.

As known in the art, writing to a flash drive, for example, such as one using SLC technology, includes performing a first operation to erase any existing data and then a second operation to write or program the device to store the new data. Although description herein may be made to performing a write operation to the flash drive for purposes of simplification in description, it will be appreciated that performing write operations to flash drives as described herein implies performing both the necessary erasure operation and program operation for writing and storing data to the flash drive. Additionally, in connection with the foregoing examples described herein regarding flash drives, wear out or usage may be expressed as being dependent on a number of erasure operations performed or a number of program operations performed although the wear out or usage is actually caused by (e.g., dependent upon) performing the implied erasure operation in order to effect the subsequent program operation to record or write new data to the flash drive. Thus, description herein for flash drives referring to wear out or usage based on a number of write operations implies the wear out or usage in accordance with the implied erasure operation necessary to effect the subsequent writing of the new data. In connection with obtaining a measurement regarding wear out or usage, the number of erasures or program operations may be used.

It should be noted that an embodiment may use techniques herein with a flash drive that performs writes to a group or portion of cells of the device, such as a block of cells. An erasure operation may be performed with respect to a size referred to as a block. A program operation to store data to an erased cell (e.g., program cycle) may be performed in units of storage referred to as pages. The size of a block is typically many multiples of a page. For example, a block size may be 128 Kb or 256 Kb and a pages may be for example 4 Kb or 8 Kb. Thus, when writing to the flash drive, a number of writes may be performed at a time in accordance with a number of cells in each block. For example, a write operation to store new data to a flash drive may write to a block of cells in which each block stores 128 kB (kilobytes) of data so that a single erase and write sequence of operations may be performed to write 128 kB of data as a unit to the block.

On average, there is an expected number of erasure operations, and thus also a number of corresponding write operations to store data thereto, which can be made to each cell of the flash drive prior to that cell being expected to experience failure or wear out so that the cell is no longer capable of storing data. In a similar manner with respect to all cells of an entire flash memory device, there is a number of such operations (write operations or erasure operations) expected to be performed prior to the device exceeding its reliable or useful limit. Therefore, given a certain write profile or rate at which writes and thus erasure operations are performed, a device may have an expected lifetime in terms of calendar or wall clock time. For example, a write rate may be specified in an amount of data written per unit of time (e.g., MB/second, GB/day, blocks/second with respect to each block) and the expected lifetime may be in terms of units of time such as years, months, days, and the like. To meet this lifetime requirement, if the drive has a published or exported storage capacity of 200 GB, it is generally not sufficient to only have 200 GB of storage capacity on the drive for a variety of reasons including, for example, possible failures at the block level, performance, device internal uses, and the like. Therefore, the actual amount of physical raw storage capacity for the device to maintain the published capacity of 200 GB may be over-provisioned to account for, for example, for possible block failures during the expected drive's lifetime and therefore be able to maintain the published storage capacity for the duration of the drive's expected lifetime.

Therefore, a flash memory storage device may be characterized as having a configured storage capacity with a set of parameters including a published storage capacity and a raw storage capacity. The published capacity may represent a logical storage capacity of an amount of user-consumable storage of the storage device. The raw capacity may represent a physical storage capacity of the storage device actually allocated to include the published capacity amount and an additional amount for over-provisioning. It should be noted that this amount of over-provisioning and the storage capacity parameters may be those determined and set by the device vendor or manufacturer. For example, a flash drive may have a published storage capacity of 200 GB and the raw storage capacity of the device may actually be 256 GB. After a certain amount of usage over a certain time, the raw storage capacity of the device is reduced because some of the blocks of cells of the flash storage media have failed. For example, after 5 years the flash drive may have a raw capacity of 210 GB. In connection with this example at the end of 5 years, there is only 10 GB of over-provisioning. It may not be feasible to continue use of this drive with a published capacity of 200 GB for another 5 years when even more block failures are expected with only this amount of over-provisioning. Additionally, as will be appreciated by those skilled in the art, having insufficient over-provisioning may also result in poor write performance since the over-provisioned storage capacity may be used internally within the device when performing its internal or on-device algorithms. In existing practice, such a device may be discarded and replaced with another new device.

In accordance with techniques herein, such a device may be reconfigured to have different storage capacity configuration parameters allowing for drive recycling and reuse with reduced published and raw storage capacities adjusted to account for the cell failures that have occurred to date. Therefore, the drive may continue to be used for an expected amount of time at a lower published capacity for the amount of raw storage capacity remaining. Continuing with our previous example where the drive has a raw capacity of 210 GB, the device may have a sufficient amount of raw storage capacity which allows the device to be used for another 5 years having a revised or new published capacity of 146 GB. The revised storage configuration parameters including the raw capacity of 210 GB and published capacity of 146 GB may be used as the reconfigured drive parameters and the drive may be used, for example, as a spare device with the revised published capacity.

In connection with the foregoing for a device such as a flash drive: C represents the published capacity in a number of blocks (e.g. block may be the smallest unit for which an erasure operation may be performed for the drive), Craw represents the raw storage capacity in number of blocks, X represents the average number of erasure operations or cycles that may be performed with respect to each of the single blocks of storage on the device prior to failure or wear out (e.g. this may be expressed as an integer quantity), W represents the write rate or rate at which write operations are performed with respect to a unit of storage such as a block (e.g., W may be specified in terms of a number of blocks written/second per block), and T represents the expected life of the device in units of time (e.g., 5 years in units of seconds, days, etc.). T may be the required or desired lifetime for which the device is to be used at the given usage rate expressed by W. It should be noted that the foregoing may be with respect to any unit of storage, time, and the like.

Based on the above, X/W may represent the expected life of a single block and C*W*T may then represent the total number of expected block writes over the expected lifetime T of the drive. Furthermore, Craw may also be represented in EQUATION A1 as:

$$Craw=(C*W*T)/X \qquad \text{EQUATION A1}$$

It should be noted that the foregoing EQUATION A1 assumes that W*T is equal to or greater than, X. A device may be configured in accordance with EQUATION A1 to maintain the relationships expressed. It should be noted that W may be obtained by observing and measuring actual customer workload. C may be obtained from vendor-standard typical device capacity. In order to obtain a value for W, information may be gathered in connection with write operations performed by a customer to determine a typical customer workload. Based on this, an average write rate per block (e.g., number of blocks written/second for a given block) may be determined. For example, let O represent an observed amount of data written/second (e.g. 30 MBs/second) for a drive having a 146 GB published drive capacity. "A" may be determined where A represents the number of blocks written/second based on O (e.g., convert O to block units). B may represent the number of blocks in 146 GB (e.g., convert drive's published capacity to block units). From this, W may be represented as A/B in block units, where block is the unit of storage for performing flash drive erase operations as described above.

Thus, EQUATION A1 may be used to determine what the raw capacity of a storage device should be given values for the other parameters of the equation. EQUATION A1 may represent Craw and C for the storage device at a first point in time such as for a new device configured by the vendor or manufacturer for a customer. At a second subsequent point in time after an amount of drive usage since the initial value determination, some of the blocks of storage may be worn out (e.g., "dead" or unusable blocks) that are no longer capable of storing data. These unusable blocks can be written to an expected number of (0) zero more times. The other remaining usable blocks may each have a remaining amount of expected writes prior to failure. An embodiment may maintain a count for each block of the number of writes and/or erasures performed with respect to each block. It should be noted that such counts for the blocks may be gathered and collected by the device and reported to executing code performing the techniques herein. Alternatively, as may be the case in some embodiments, such count information may not be directly maintained and available. In such embodiments, the counts may be obtained indirectly or derived through other means using available information. For example, an embodiment may estimate the counts by observing reported error corrections or retries experienced when an erasure and/or program cycle fails.

At this second point in time, the expected number of erase operations remaining for a single block prior to expected failure or wear out may be represented as either:

0 if the block is unusable at the second point in time, or

X-Xi, where Xi is the number of erasure operations performed on the block i and X is as represented above at the initial or first point in time.

X' may represent the revised average expected lifetime or number of remaining expected erase operations for a single block prior to failure, where the average is determined with respect to/across all blocks, i, on the drive (e.g., with respect to the initial Craw determined at the first point in time and including currently unusable or dead blocks). X' may be represented as:

$$X' = E_{i=1}^{Craw}(X-Xi)/Craw \qquad \text{EQUATION A2}$$

In EQUATION A2, Craw may be expressed in terms of the number of blocks comprising the initial raw storage capacity of the device at the first point in time including all blocks, whether functional (e.g., can be used for additional writes) or not (e.g. dead or unusable) at the second point in time. At this second point in time, X' as represented by EQUATION A2, is the revised average expected remaining lifetime for a block (e.g., remaining expected number of erase operations prior to failure).

At this second point in time, EQUATION A1 may again be used to solve for C to determine a new or revised published capacity C' using the revised X' value from EQUATION A2 at the second point in time. C' may be represented as:

$$C' = (Craw*X')/(W*T) \qquad \text{EQUATION A3}$$

where X' is obtained using EQUATION A2, W, T and Craw may be those values used in connection with EQUATION A1 at the first point in time. At this point the value of C' from EQUATION A3 satisfies the T or desired lifetime requirement but may not satisfy the over-provisioning requirement which may be determined using EQUATION A4, described below. In other words, C' may require further adjustment in order to satisfy the additional criteria or factor for over-provisioning. As noted elsewhere herein and also known in the art, for performance and other considerations, storage device capacity configuration may utilize an over-provisioning factor, F. For example, F may be 0.25 or 25%. More generally, F may be represented as in EQUATIONS B1 and B2:

$$F = (Cr-C)/C \qquad \text{EQUATION B1}$$

$$= (Cr/C)-1 \qquad \text{EQUATION B2}$$

It should be noted that F is a parameter of the original device configuration as may be determined by the vendor or device manufacturer. Subsequently, in connection with use of the techniques herein for device storage capacity reconfiguration, F may be maintained across all reconfigurations of a recycled drive (e.g., with new revised published capacity). It should also be noted that X, as used in the initial capacity configuration at the first point in time with EQUATION A1, may be published as part of the flash drive specification. As noted above, W may vary with actual customer usage.

In connection with the second point in time and determining whether the revised published capacity C' as determined using EQUATION A3 needs further adjustment to account for the provisioning factor F, let Craw' represent the number of blocks of the flash drive which are not dead or worn out (e.g., are still usable and capable of being written to at the second point in time). Craw' may represent the revised raw capacity at the second point in time. In connection with determining a revised published capacity for the device at the second point in time and considering the provisioning factor F and Craw' another value denoted Cp may be determined as represented using EQUATION A4:

$$Cp = (1/(1+F))*Craw' \qquad \text{EQUATION A4}$$

Cp may represent a second intermediate revised published capacity value taking into account criteria including Craw' (revised raw capacity) and F (provisioning factor). C', as determined using EQUATION A3, may represent a first intermediate revised published capacity value taking into account desired lifetime without considering the provisioning factor.

In connection with the foregoing, an embodiment may not be able to use C' as the new published capacity if there is insufficient over-provisioning based on the revised usable raw capacity Craw'. Thus, at this point, if Cp<C', then Cp may be used as the revised or new published capacity, Crevised. Otherwise, C' may be used as the revised or new published capacity, Crevised.

Furthermore, an additional adjustment to the selected one of either C' or Cp (e.g., Crevised) may be performed depending on the possible published capacities that a vendor may sell. For example, storage devices may be sold by a vendor in which each such device is one of a predefined set of published storage capacities. (e.g., increments of 100 GB so the predefined set of published capacities may include 100 GB, 200 GB, 300 GB, and so on). Thus, a vendor reconfiguring storage capacity parameters of a storage device may determine whether a further adjustment to the revised published capacity Crevised is needed so that the final published capacity of the reconfigured drive is one of the predefined set of published capacities. Therefore, if Crevised is between two such predefined published capacity values, Crevised may be further adjusted to be the lower or minimum of these two values. For example, if drives are sold only in published storage capacities of 100 GB increments (e.g., 100 GB, 200 GB, 300 GB, etc.) as described above and Crevised is determined as 240 GB, Crevised may be further modified to be 200 GB since 240 GB is between 200 GB and 300 GB. Therefore, the storage device may be reconfigured to have a revised raw storage capacity Craw' and a revised published capacity Crevised.

The techniques herein may be used to recycle or reuse flash drives after they have been in use for an expected lifetime such as represented as T in EQUATION A1. The recycled drive may be a reconfigured drive with new operating or capacity parameters. Such reconfigured drives may be used as spares within an existing system, sold by a vendor as recycled drives, and the like. The techniques herein may be used in connection with a variety of different types of drives which are SSDs as well as other technologies where the primary wear out depends on the underlying storage medium/technology and where such physical storage wears out in an incremental manner over time so that the expected lifetime decreases based on usage of the underlying storage medium/technology.

It should be noted that wear leveling is one technique that may be used internally within a flash drive to attempt to evenly use or distribute write/erases across cells/blocks of the device. Wear leveling may be characterized as a technique that attempts to arrange or store data on the flash drive where erasures and rewrites are evenly distributed so that no single cell prematurely fails due to a high concentration of writes. As such, each physical location of the flash drive may be expected to have approximately a same number of writes prior to device failure. In connection with the techniques herein for drive recycling, an embodiment may select to not utilize such wear leveling techniques. This may allow for reduction in internal mapping done within the drive which may be used in connection with wear leveling and may therefore result in increased performance and other benefits. In fact, an embodiment may choose to utilize internally on the flash drive wear "unleveling" techniques to force or target blocks for writes/erasures with the goal of causing certain blocks to fail prior to others due to wear out or usage. For example, in contrast to wear leveling, wear unleveling may purposefully select the blocks/cells used for write operations to utilize those now which have the highest or most usage to date/current point in time. In such embodiments, techniques may be utilized to target particular areas/portions of the flash drive for write operations such as described, for example, in U.S. Pat. No. 7,865,761, Issued Jan. 4, 2011, to Chilton, ACCESSING MULTIPLE NON-VOLATILE SEMICONDUCTOR MEMORY MODULES IN AN UNEVEN MANNER, which is incorporated by reference herein. Thus, an embodiment in accordance with techniques herein may vary underlying algorithms and techniques performed internally on the flash drive.

As described above, F, representing the over-provisioning factor, is typically a published parameter with a drive. F may vary with the underlying techniques internally performed on the drive. For example, a sufficiently large F is desired to have performance benefits. However, that interest is balanced with the fact that the larger F is, the less physical capacity is assumed for storing user data.

An embodiment may implement the techniques herein using code executed by a processor. For example, an embodiment may implement the techniques herein using code which is executed by a processor of the workstation, host, data storage system, It should be noted that as described herein with respect to flash drives, wear out or usage affecting the device lifetime and expected point of device failure may be based on the number of erasure operations performed. Thus, since each erasure is typically followed by a write and the desire to write new data being the reason for performing the erasure, the lifetime of a flash drive may be expressed as a number of expected writes or associated erasure operations performed. In connection with flash drives as described herein, writes may performed with respect to a portion of the device, such as a block, rather than individual cells. Thus, erasures and writes may be performed with respect to entire blocks of data at a time (e.g., as a single operation) rather than with respect to individual cells.

Exemplary uses of the techniques are provided herein in connection with a flash memory having a lifetime determined primarily based on wear out or usage expected prior to device failure. An embodiment, for example, may use a flash drive based on MLC technology and the techniques herein may be used to extend the lifetime of the flash drive using MLC technology to be the same as a second flash drive using SLC technology by controlling the write performance rate to the flash drives. However, as described herein, the techniques herein may be used in connection with drives based on other technologies having a primary failure due to wear out or usage.

What will now be described are flowcharts in connection with FIGS. 3 and 4 summarizing processing as may be performed in an embodiment in accordance with techniques herein. The flowcharts summarized processing generally described above as may be used in connection with reconfiguring storage capacity parameters of a device.

Figure 3:
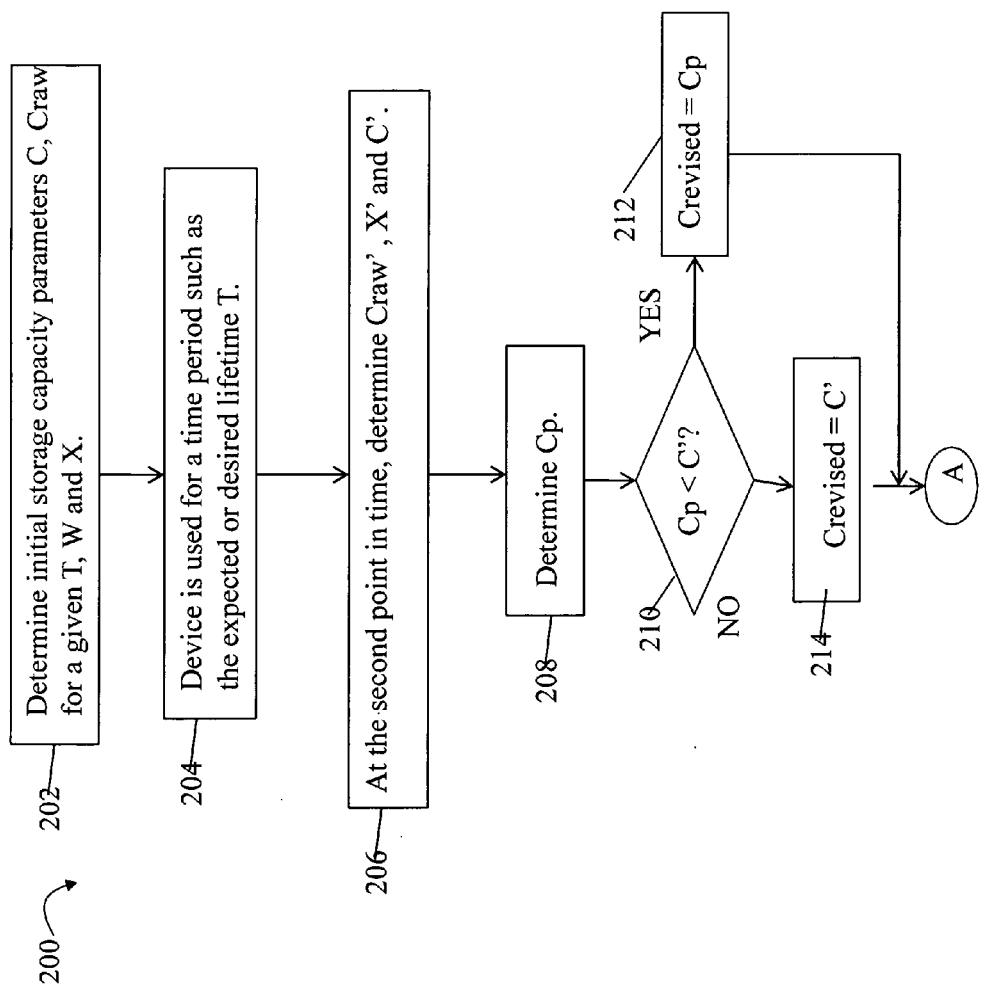
FIGS. 3 and 4 are flowcharts of processing steps that may be performed in an embodiment performing the techniques herein.
Figure 4:
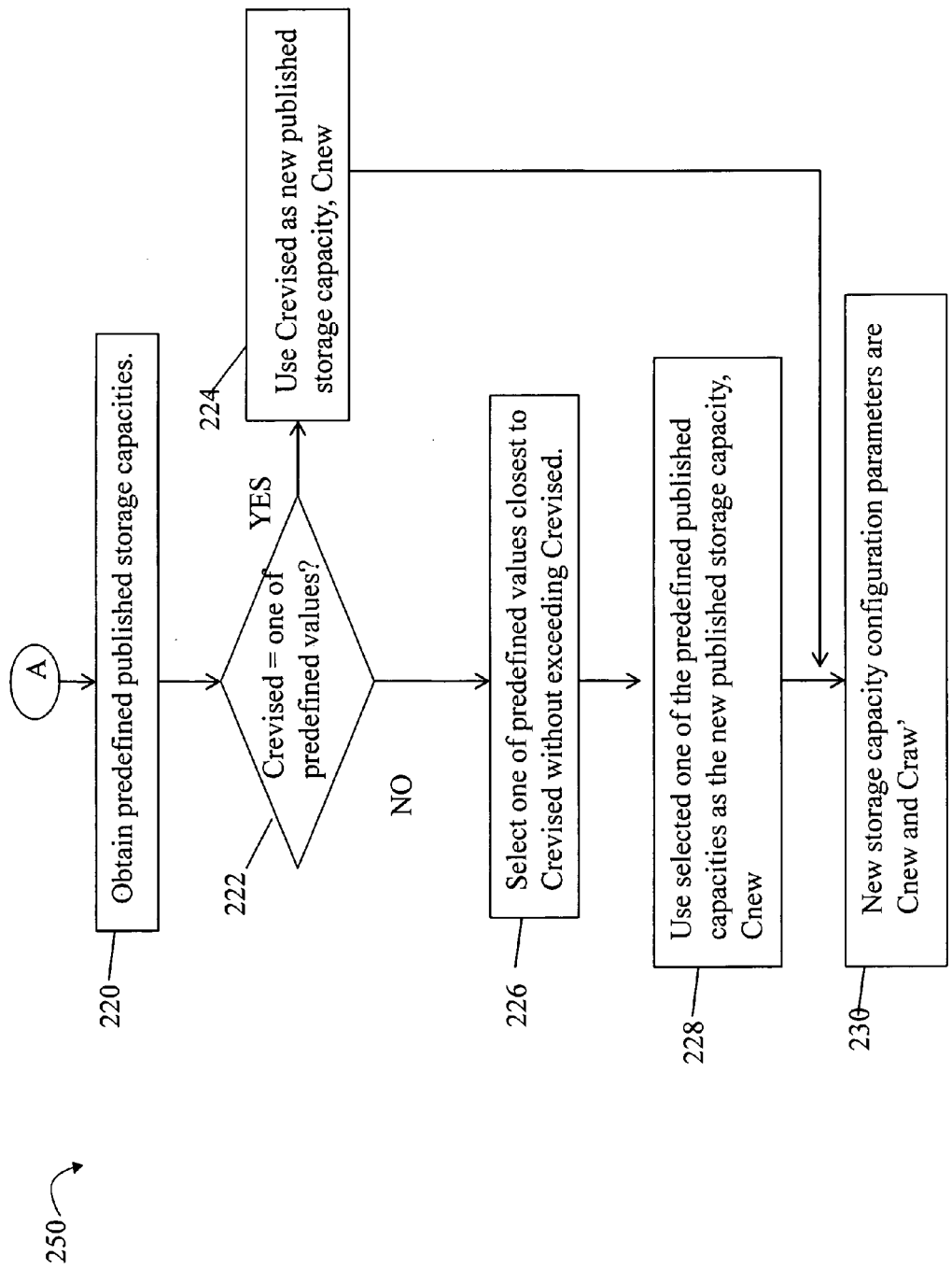

Referring to FIGS. 3 and 4, shown are flowcharts of processing steps that may be performed in an embodiment in accordance with techniques herein. At step 202, initial storage capacity parameters may be determined for a device such as a flash drive. Such parameters may include C and Craw as described above for a given T, W and X in connection with EQUATION A1. At step 204, the device is used for a time period such as for its expected or desired lifetime T. At step 206, at this second point in time after time period T has elapsed, Craw', X' and C' may be determined. X' may be determined as described above in connection with EQUATION A2 and C' may be determined as also described above in connection with EQUATION A3. At step 208, Cp may be determined such as in accordance with EQUATION A4 described above. At step 210, a determination is made as to whether Cp is less than C'. If so, control proceeds to step 212 where Crevised=Cp. Otherwise, if step 210 evaluates to NO, control proceeds to step 214 where Crevised=C'. At step 220, predefined published storage capacities may be obtained. At step 222, a determined is made as to whether Crevised is one of these predefined published storage capacities. If step 222 evaluates to yes, control proceeds to step 224 where Crevised is used as the new published storage capacity, Cnew and control proceeds to step 230. If step 222 evaluates to no, control proceeds to step 226, where one of the predefined values of step 220 is selected. The selected value is the one of the predefined values which is closest to Crevised without exceeding Crevised. At step 228, the selected published capacity is used as the new published storage capacity, Cnew and control proceeds to step 230. At step 230, the new storage capacity configuration parameters are Cnew and Craw'.

It should be noted that in the event that there are no predefined storage capacities, the additional processing described in connection with steps 220, 222, 226 and 228 may be omitted and Crevised used as the new published storage capacity Cnew.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of reconfiguring a storage device comprising:
receiving a first plurality of parameters characterizing said storage device at a first point in time, said first plurality of parameters including a first raw capacity, and a first published capacity, wherein said first raw capacity represents a physical storage capacity of the storage device at the first point in time and said first published capacity represents a logical storage capacity of an amount of user-consumable storage of said storage device at said first point in time; and
determining a second plurality of parameters characterizing said storage device at a second point in time subsequent to said first point in time to account for physical media portions of said storage device that have failed since said first point in time, said second plurality of parameters including a second raw capacity and a second published capacity, wherein said second raw capacity represents a physical storage capacity of the storage device at the second point in time and said second published capacity represents a logical storage capacity of an amount of user-consumable storage of the storage device at said second point in time, wherein said second raw capacity represents a portion of the storage device capable of storing data at said second point in time, said second raw capacity being less than said first raw capacity due to physical media portions of the storage device experiencing failure since the first point time, said second published capacity being less than said first published capacity, wherein said determining said second plurality of parameters comprises:
determining a first intermediate published capacity in accordance with first factors including T representing an expected lifetime for the storage device;
determining a second intermediate published capacity in accordance with second factors including an over-provisioning factor and the second raw capacity; and
performing other processing that determines the second published capacity using a selected one of the first intermediate published capacity and the second intermediate published capacity.

2. The method of claim 1, wherein said storage device is a solid state storage device.

3. The method of claim 1, wherein, said storage device is expected to perform a number of operations prior to failure and wherein physical media portions of said storage device at which data is stored experience failure primarily due to performing said operations so that a remaining expected lifetime of said storage device is determined at any point in time based on a cumulative amount of said operations performed with respect to said storage device up to said any point in time.

4. The method of claim 3, wherein said operations are any of a write operation, an erasure operation to erase data currently stored in a portion of said storage device and a program operation to store new data to a portion of said storage device.

5. The method of claim 1, wherein said first raw capacity varies in accordance with said first published capacity, X representing an average number of erase operations remaining per unit of storage of said storage device prior to failure, T and W representing a rate at which a number of write operations are performed per unit of time per unit of storage with respect to the storage device.

6. The method of claim 5, wherein said determining said second plurality of parameters includes:
determining X' representing a revised average number of erase operations remaining per unit of storage of said storage device at said second point in time prior to failure; and
determining said first intermediate published capacity in accordance with X', said first raw capacity, W and T.

7. The method of claim 6, further comprising:
determining a first portion of the storage device incapable of storing data at the second point in time;
determining, in accordance with the first portion and the first raw capacity, said second raw capacity that represents a portion of the storage device capable of storing data at said second point in time; and
determining whether said second intermediate published capacity is less than said first intermediate published capacity.

8. The method of claim 7, wherein if said second intermediate published capacity is less than the first intermediate published capacity, the method further comprises:
determining said second published capacity using said second intermediate published capacity.

9. The method of claim 8, further comprising:
determining whether the second intermediate published capacity is one of a plurality of predetermined drive capacities;
if it is determined that the second intermediate published capacity is one of the predetermined drive capacities, using said second intermediate published capacity as the second published capacity; and
if it is determined that the second intermediate published capacity is not one of the predetermined drive capacities, performing first processing including:
determining a first of the predetermined drive capacities which is closest to said second intermediate published capacity and is not greater than said second intermediate published capacity; and
using said first predetermined drive capacity as said second published capacity.

10. The method of claim 7, wherein if said second intermediate published capacity is not less than the first intermediate published capacity, the method further comprises:
determining said second published capacity using said first intermediate published capacity.

11. The method of claim 10, further comprising:
determining whether the first intermediate published capacity is one of a plurality of predetermined drive capacities;
if it is determined that the first intermediate published capacity is one of the predetermined drive capacities, using said first intermediate published capacity as the second published capacity; and
if it is determined that the first intermediate published capacity is not one of the predetermined drive capacities, performing first processing including:

determining a first of the predetermined drive capacities which is closest to said first intermediate published capacity and is not greater than said first intermediate published capacity; and using said first predetermined drive capacity as said second published capacity.

12. The method of claim 1, wherein said storage device is used as a spare device at said second point in time.

13. The method of claim 1, wherein said storage device is a flash memory device.

14. The method of claim 1, wherein said first published capacity and said second published capacity are each determined in accordance with the over-provisioning factor.

15. The method of claim 1, wherein said storage device is used at said first point in time as a device having said first plurality of parameters and wherein said storage device is used at said second point in time as a device having said second plurality of parameters.

16. The method of claim 1, wherein the overprovisioning factor does not vary with usage of the storage device and is maintained across reconfigurations of the storage device.

17. A non-transitory computer readable medium comprising code stored thereon for reconfiguring a storage device, the non-transitory computer readable medium comprising code stored thereon that, when executed, performs a method comprising:

receiving a first plurality of parameters characterizing said storage device at a first point in time, said first plurality of parameters including a first raw capacity, and a first published capacity, wherein said first raw capacity represents a physical storage capacity of the storage device at the first point in time and said first published capacity represents a logical storage capacity of an amount of user-consumable storage of said storage device at said first point in time; and determining a second plurality of parameters characterizing said storage device at a second point in time subsequent to said first point in time to account for physical media portions of said storage device that have failed since said first point in time, said second plurality of parameters including a second raw capacity and a second published capacity, wherein said second raw capacity represents a physical storage capacity of the storage device at the second point in time and said second published capacity represents a logical storage capacity of an amount of user-consumable storage of the storage device at said second point in time, wherein said second raw capacity represents a portion of the storage device capable of storing data at said second point in time, said second raw capacity being less than said first raw capacity due to physical media portions of the storage device experiencing failure since the first point time, said second published capacity being less than said first published capacity, wherein said determining said second plurality of parameters comprises:

determining a first intermediate published capacity in accordance with first factors including T representing an expected lifetime for the storage device;

determining a second intermediate published capacity in accordance with second factors including an over-provisioning factor and the second raw capacity; and performing other processing that determines the second published capacity using a selected one of the first intermediate published capacity and the second intermediate published capacity.

18. The non-transitory computer readable medium of claim 17, wherein said storage device is a solid state storage device.

19. The non-transitory computer readable medium of claim 17, wherein, said storage device is expected to perform a number of operations prior to failure and wherein physical media portions of said storage device at which data is stored experience failure primarily due to performing said operations so that a remaining expected lifetime of said storage device is determined at any point in time based on a cumulative amount of said operations performed with respect to said storage device up to said any point in time.

20. The non-transitory computer readable medium of claim 19, wherein said operations are any of a write operation, an erasure operation to erase data currently stored in a portion of said storage device and a program operation to store new data to a portion of said storage device.

21. The non-transitory computer readable medium of claim 17, wherein said first raw capacity varies in accordance with said first published capacity, X representing an average number of erase operations remaining per unit of storage of said storage device prior to failure, T and W representing a rate at which a number of write operations are performed per unit of time per unit of storage with respect to the storage device.

22. The non-transitory computer readable medium of claim 17, wherein said storage device is used as a spare device at said second point in time.

* * * * *